US009626811B2

(12) United States Patent
Ramesh (10) Patent No.: US 9,626,811 B2
(45) Date of Patent: *Apr. 18, 2017

(54) VEHICLE FAULT EARLY WARNING SYSTEM

(71) Applicant: Atieva, Inc., Menlo Park, CA (US)

(72) Inventor: Vineeth Ramesh, Fremont, CA (US)

(73) Assignee: ATIEVA, INC., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/286,409

(22) Filed: Oct. 5, 2016

(65) Prior Publication Data

US 2017/0024937 A1    Jan. 26, 2017

Related U.S. Application Data

(63) Continuation-in-part of application No. 14/309,238, filed on Jun. 19, 2014, now Pat. No. 9,495,814.

(51) Int. Cl.
| | |
|---|---|
| *G07C 5/00* | (2006.01) |
| *H04L 29/08* | (2006.01) |
| *G07C 5/08* | (2006.01) |
| *B60L 11/18* | (2006.01) |
| *G01R 31/36* | (2006.01) |
| *H04W 88/02* | (2009.01) |

(52) U.S. Cl.
CPC .......... *G07C 5/008* (2013.01); *B60L 11/1861* (2013.01); *G01R 31/3606* (2013.01); *G01R 31/3658* (2013.01); *G07C 5/0808* (2013.01); *H04L 67/12* (2013.01); *H04L 67/26* (2013.01); *G07C 5/0816* (2013.01); *H04W 88/02* (2013.01)

(58) Field of Classification Search
CPC .... G07C 5/008; G07C 5/0808; G07C 5/0816; H04L 67/12; H04L 67/26; B60L 11/1861; G01R 31/3658; G01R 31/3606; H04W 88/02
USPC ........................................................ 701/29.3
See application file for complete search history.

(56) References Cited

U.S. PATENT DOCUMENTS

| | | | |
|---|---|---|---|
| 4,345,199 A | 8/1982 | Voss | |
| 5,699,056 A | 12/1997 | Yoshida | |
| 5,737,215 A | 4/1998 | Schricker | |
| 6,611,774 B1 * | 8/2003 | Zaccaria | G01R 31/3648 320/116 |
| 6,792,351 B2 | 9/2004 | Lutter | |
| 7,123,926 B2 | 10/2006 | Himmelstein | |
| 7,174,253 B2 | 2/2007 | Videtich | |
| 7,425,903 B2 | 9/2008 | Boss | |

(Continued)

FOREIGN PATENT DOCUMENTS

JP          2008121916 A      5/2008

*Primary Examiner* — Fadey Jabr
*Assistant Examiner* — Angelina Shudy
(74) *Attorney, Agent, or Firm* — Patent Law Office of David G. Beck (57) ABSTRACT

A vehicle fault early warning system is provided in which a central processing system (e.g., vehicle manufacturer, service center, third party) transmits a warning once a set of conditions is identified that routinely leads to a particular vehicle malfunction, where the malfunction may either cause the failure of a component/subsystem or cause a component/subsystem to perform out-of-spec. The warning may be accompanied by instructions as to how to avoid, or at least mitigate, the effects of the vehicle malfunction.

13 Claims, 4 Drawing Sheets

(56) References Cited

U.S. PATENT DOCUMENTS

| | | |
|---|---|---|
| 7,849,149 B2 | 12/2010 | Habaguchi |
| 8,296,197 B2 | 10/2012 | Avery |
| 8,634,033 B2 | 1/2014 | Vanderwall |
| 8,952,800 B2 | 2/2015 | Bantz |
| 9,356,464 B2 * | 5/2016 | Tomiyasu ............. H02J 7/0091 |
| 9,387,882 B2 | 7/2016 | Han |
| 9,495,814 B2 * | 11/2016 | Ramesh ................ G07C 5/0808 |
| 2002/0038182 A1 | 3/2002 | Wong |
| 2002/0067289 A1 | 6/2002 | Smith |
| 2002/0156558 A1 | 10/2002 | Hanson |
| 2003/0065771 A1 | 4/2003 | Cramer |
| 2004/0138790 A1 | 7/2004 | Kapolka |
| 2004/0267446 A1 | 12/2004 | Minato |
| 2005/0065678 A1 | 3/2005 | Smith |
| 2005/0065711 A1 | 3/2005 | Dahlgren |
| 2007/0083305 A1 | 4/2007 | Okada |
| 2007/0265742 A1 | 11/2007 | Thiel |
| 2009/0254259 A1 | 10/2009 | The |
| 2010/0057290 A1 | 3/2010 | Brillhart et al. |
| 2010/0211249 A1 | 8/2010 | McClellan |
| 2011/0130905 A1 | 6/2011 | Mayer |
| 2011/0160934 A1 | 6/2011 | Harata |
| 2011/0276313 A1 | 11/2011 | Inaba |
| 2012/0046893 A1 * | 2/2012 | Kaneko ............. G01R 31/3658 702/63 |
| 2012/0235805 A1 | 9/2012 | Nogami |
| 2013/0246135 A1 | 9/2013 | Wang |
| 2013/0282921 A1 | 10/2013 | Tran |
| 2013/0338855 A1 * | 12/2013 | Mason ................ G07C 5/0816 701/2 |
| 2014/0168827 A1 | 6/2014 | Mirzaei |
| 2015/0127228 A1 | 5/2015 | Jeong et al. |
| 2015/0137962 A1 | 5/2015 | Binnicker |
| 2015/0307086 A1 | 10/2015 | Ketfi-Cherif et al. |
| 2015/0344070 A1 | 12/2015 | Han |
| 2015/0356794 A1 | 12/2015 | Prakah-Asante et al. |
| 2015/0363797 A1 * | 12/2015 | Ramesh ............. G06Q 30/0201 705/7.29 |
| 2015/0371462 A1 * | 12/2015 | Ramesh ............... G07C 5/0808 701/29.3 |

* cited by examiner

VEHICLE FAULT EARLY WARNING SYSTEM

CROSS-REFERENCE TO RELATED APPLICATION

This application is a continuation-in-part of U.S. patent application Ser. No. 14/309,238, filed 19 Jun. 2014, the disclosure of which is incorporated herein by reference for any and all purposes.

FIELD OF THE INVENTION

The present invention relates generally to a vehicle and, more particularly, to a vehicle fault identification and notification system.

BACKGROUND OF THE INVENTION

Throughout the years, the automobile industry has strived to provide drivers with a variety of means for monitoring vehicle performance and obtaining an early warning of potential issues that could lead to a serious, or even catastrophic, vehicle malfunction. Initially analog gauges were used to monitor specific vehicle operating characteristics such as oil pressure, engine temperature, fuel tank level, and charging system voltage, thus allowing the driver to monitor subsystem performance. In some instances, a light was added to draw the driver's attention to a particular situation, for example extremely low oil pressure or a fuel tank approaching empty. Eventually, in order to reduce manufacturing costs and in recognition of the fact that the majority of drivers did not require, or even utilize, the detailed information provided by the vehicle's gauges, some car manufacturers began eliminating gauges, thereby requiring the driver to rely solely on warning lights. Unfortunately warning lights only help to identify the system that is malfunctioning while providing little help in preventing the problem. Accordingly, what is needed is a system that may be used to warn a driver of a situation or a set of conditions that may lead to a vehicle malfunction, thus helping the driver avoid the identified situation or otherwise mitigate the conditions that may lead to the malfunction. The present invention provides such a warning system.

SUMMARY OF THE INVENTION

The method of the present invention provides a fault warning notification to a plurality of vehicles, the method comprising the steps of (i) monitoring a set of battery pack characteristics with a plurality of on-board sensors, the set of battery pack characteristics selected from the group consisting of a battery pack operating temperature, a state-of-charge (SOC), and a discharge rate, where each vehicle of the plurality of vehicles monitors the set of battery pack characteristics with an on-board controller; (ii) monitoring a set of ambient environmental conditions with the plurality of on-board sensors, the set of ambient environmental conditions selected from the group consisting of an ambient temperature, a precipitation level, a humidity level, an atmospheric pressure, and an elevation, where each vehicle of the plurality of vehicles monitors the set of ambient environmental conditions with the on-board controller; (iii) transmitting a data log comprising the set of battery pack characteristics and the set of ambient environmental conditions concurrent with the set of battery pack characteristics to a central processing system, where each vehicle of the plurality of vehicles performs the transmitting step utilizing the on-board controller; (iv) analyzing the plurality of data logs comprised of the data log received from each vehicle of the plurality of vehicles, where the central processing system performs the analyzing step, and where the analyzing step further comprises comparing each set of battery pack characteristics corresponding to each data log to a set of desired operating characteristics; (v) identifying each occurrence of a fault event within the plurality of data logs, where the fault event occurs when at least one of the set of battery pack characteristics falls outside of the set of desired operating characteristics, where the central processing system performs the identifying step; (vi) comparing a plurality of fault events corresponding to the plurality of data logs, where the central processing system performs the step of comparing the plurality of fault events; (vii) identifying a subset of the plurality of fault events, where the ambient environmental conditions concurrent with each fault event of the subset of the plurality of fault events are analogous; and (viii) transmitting a warning notification to each vehicle of the plurality of vehicles when a numerical value corresponding to a number of fault events comprising the subset of the plurality of fault events exceeds a preset value, where the step of transmitting the warning notification is performed by the central processing system, and where the warning notification identifies the fault event of the subset of the plurality of fault events and the ambient environmental conditions concurrent with that fault event. Each vehicle of the plurality of vehicles may transmit its data log continuously or periodically to the central processing system. The fault warning notification may be wireles sly transmitted to an on-board user interface incorporated into each of the vehicles; and/or the fault warning notification may be wirelessly transmitted via an application installed on each of a plurality of user smartphones.

In one aspect, the step of transmitting a fault warning notification may further comprise the step of transmitting a set of fault mitigation instructions to each vehicle of the plurality of vehicles, where the set of fault mitigation instructions correspond to the fault event of the subset of the plurality of fault events. The fault mitigation instructions may be wirelessly transmitted to an on-board user interface incorporated into each vehicle of the plurality of vehicles and/or wirelessly transmitted via an application installed on each of a plurality of user smartphones.

In another aspect, the data log may further comprise a set of vehicle conditions concurrent with the set of battery pack characteristics, the set of vehicle conditions selected from the group consisting of throttle position, vehicle speed, steering wheel position, motor speed, motor temperature, drive train temperature, and heating, ventilation and air conditioning (HVAC) settings. The warning notification may identify the fault event and the set of vehicle conditions concurrent with the fault event.

In another aspect, the set of ambient environmental conditions may further comprise a current vehicle location. The warning notification may identify the fault event and the current vehicle location concurrent with the fault event.

In another aspect, the data log may further comprise a drive train operating temperature concurrent with the set of battery pack characteristics, and the analyzing step may further comprise comparing the drive train operating temperature to a desired drive train operating temperature, where the fault event occurs when the drive train operating temperature exceeds the desired drive train operating temperature.

A further understanding of the nature and advantages of the present invention may be realized by reference to the remaining portions of the specification and the drawings.

BRIEF DESCRIPTION OF THE DRAWINGS

It should be understood that the accompanying figures are only meant to illustrate, not limit, the scope of the invention and should not be considered to be to scale. Additionally, the same reference label on different figures should be understood to refer to the same component or a component of similar functionality.

DESCRIPTION OF THE SPECIFIC EMBODIMENTS

As used herein, the singular forms "a", "an" and "the" are intended to include the plural forms as well, unless the context clearly indicates otherwise. The terms "comprises", "comprising", "includes", and/or "including", as used herein, specify the presence of stated features, process steps, operations, elements, and/or components, but do not preclude the presence or addition of one or more other features, process steps, operations, elements, components, and/or groups thereof. As used herein, the term "and/or" and the symbol "/" are meant to include any and all combinations of one or more of the associated listed items. Additionally, while the terms first, second, etc. may be used herein to describe various steps, calculations, or components, these steps, calculations, or components should not be limited by these terms, rather these terms are only used to distinguish one step, calculation, or component from another. For example, a first calculation could be termed a second calculation, and, similarly, a first step could be termed a second step, and, similarly, a first component could be termed a second component, without departing from the scope of this disclosure. The terms "electric vehicle" and "EV" may be used interchangeably and refer to an all-electric vehicle.

Figure 1:
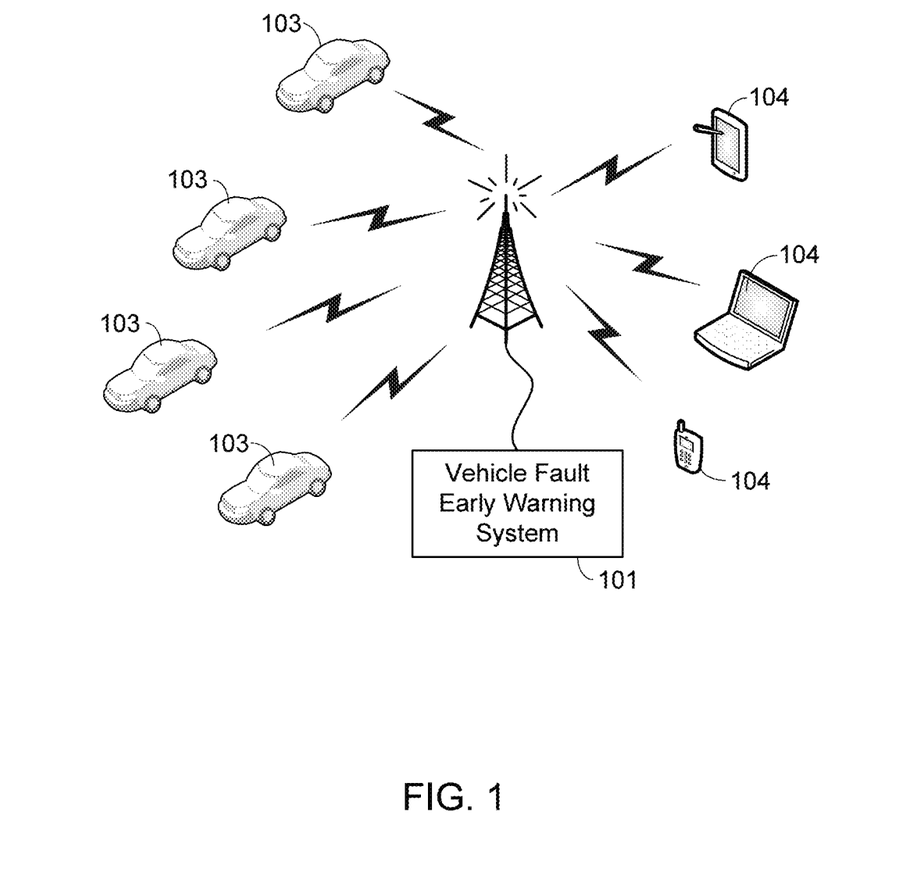
FIG. 1 illustrates a communication system for use with the invention.

In accordance with the invention, and as illustrated in FIG. 1, an early warning central processing system 101 is able to wireles sly communicate with a plurality of vehicles 103, thus allowing central processing system 101 to identify conditions that routinely lead to a particular vehicle malfunction, or conditions that routinely cause a particular vehicle system to operate outside of its preferred operating range (i.e., out-of-spec). Once a set of conditions are identified, system 101 can send a notice to other vehicle owners, either via a user interface incorporated into each vehicle 103 or via an application installed on a user device 104 (e.g., smartphone, tablet, laptop, computer, etc.), thus helping other drivers avoid the same problem. It should be understood that warning system 101 may be operated by the vehicle's manufacturer, or a party working on behalf of the manufacturer, or a third party.

Figure 2:
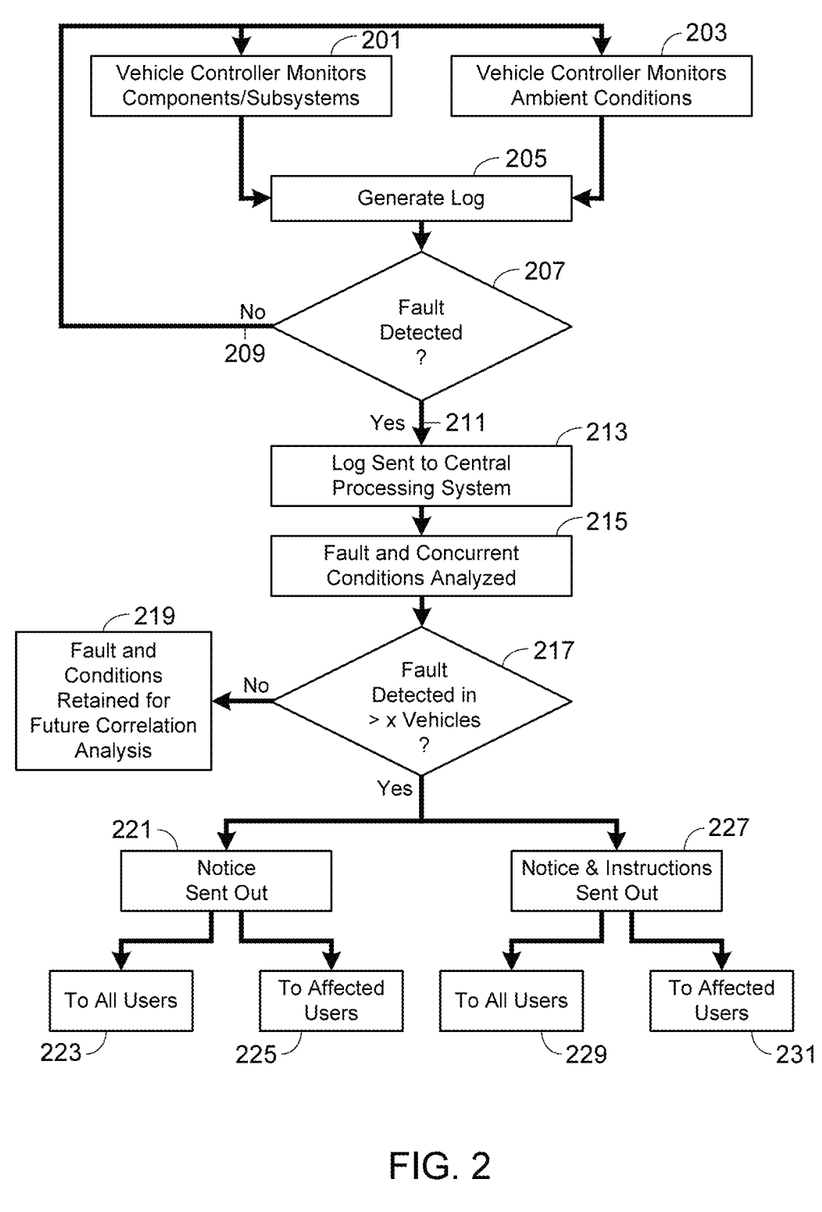
FIG. 2 illustrates the basic methodology of the invention in accordance with a preferred embodiment.

FIG. 2 illustrates the methodology associated with one embodiment of the invention. In step 201, each vehicle 103 monitors the performance of a preselected set of vehicle subsystems and components. For example, during step 201 the vehicle may monitor battery pack performance, assuming that vehicle 103 is an EV, where performance is given in terms of state-of-charge (SOC), discharge rate, operating temperature, etc. Alternately, if vehicle 103 is an internal combustion engine (ICE) based vehicle, during step 201 the system may monitor engine oil pressure, coolant temperature, air flow through the intake, emissions, etc. It will be appreciated that the car control systems used in modern cars, both EVs and ICE-based vehicles, already monitor a variety of systems and components in order to detect out-of-range operating values and as such, the monitors used during step 201 are well known by those of skill in the art.

At the same time as the vehicle's system controller is monitoring preselected vehicle subsystems and components, it is also monitoring ambient conditions (step 203). In this context, ambient conditions refer both to environmental conditions and operating conditions. For example, during step 203 the ambient temperature is preferably monitored as are other environmental conditions (e.g., precipitation, humidity, atmospheric pressure, elevation, geographic location, etc.). Additionally during step 203 various operating conditions are preferably monitored (e.g., battery pack SOC, throttle position, vehicle speed, steering wheel position, motor or engine speed, HVAC settings, etc.).

In the illustrated embodiment, the operating performance of the various subsystems and components monitored in step 201 as well as the concurrent ambient conditions determined in step 203 are recorded in a vehicle data log (step 205). During step 207 the on-board vehicle controller monitors for vehicle faults. A vehicle fault may be as minor as one of the vehicle subsystems or components operating outside of its desired operating range, or as significant as a complete failure of the component or vehicle system. As long as a fault is not detected (step 209), the system continues to monitor vehicle performance and concurrent ambient conditions while generating a data log of both.

Once the vehicle controller detects a fault in a vehicle component or subsystem (step 211), the data log is automatically and wireles sly transmitted to central processing system 101 (step 213). Preferably only a portion of the data log is transmitted during step 213, for example the data log starting at a preset period of time before the fault was detected. The central processing system 101 analyzes the fault as well as the ambient conditions both at the time of the fault and the conditions that preceded the fault (step 215).

During step 217 the central processing system correlates the fault and the conditions surrounding the fault with similar faults detected in other vehicles 103. If the detected fault is the only known occurrence under these or similar conditions, or if the detected fault has been observed in too few vehicles, then the central processing system 101 simply records the fault and the conditions surrounding the fault for possible correlation with future detected events (step 219). If, however, the central processing system 101 determines that the fault is not simply an isolated component or system failure, rather it is a fault that has been detected in other vehicles under similar circumstances, then the system sends out a notification to other users (step 221). The notice may be sent to all users (step 223), warning each user that a certain type of fault may occur under a specific set of conditions, thus allowing each driver to modify their driving style or otherwise compensate for the conditions that may lead to the detected fault. Alternately, the notice may only be sent to those vehicles that are likely to experience the same fault based on the affected vehicle's current ambient conditions, e.g., current location, current elevation, ambient temperature, SOC, etc. (step 225).

In some embodiments, after the central processing system 101 determines that the fault detected in step 207 has been detected in other vehicles under similar circumstances and in sufficient quantity to warrant a notification per step 221, in addition to sending out the notification regarding the fault warning, the controller may also send out a possible solution (i.e., a work-around) to the detected fault (step 227). Exemplary solutions include modifying the user's driving style (e.g., driving less aggressively), altering an EV's charging schedule, modifying HVAC settings, limiting power drain due to auxiliary systems, raising suspension height, etc. The notice and possible solution may be sent to all users (step 229) or only to those vehicles that are likely to experience the same fault based on the affected vehicle's current ambient conditions (step 231). Note that the notices (step 221) as well as the notices that include instructions (step 227) may either be sent to the vehicles 103 using an on-board interface, or they may be sent to the users using an application installed on a user device 104 (e.g., smartphone, tablet, laptop, computer, etc.).

Figure 3:
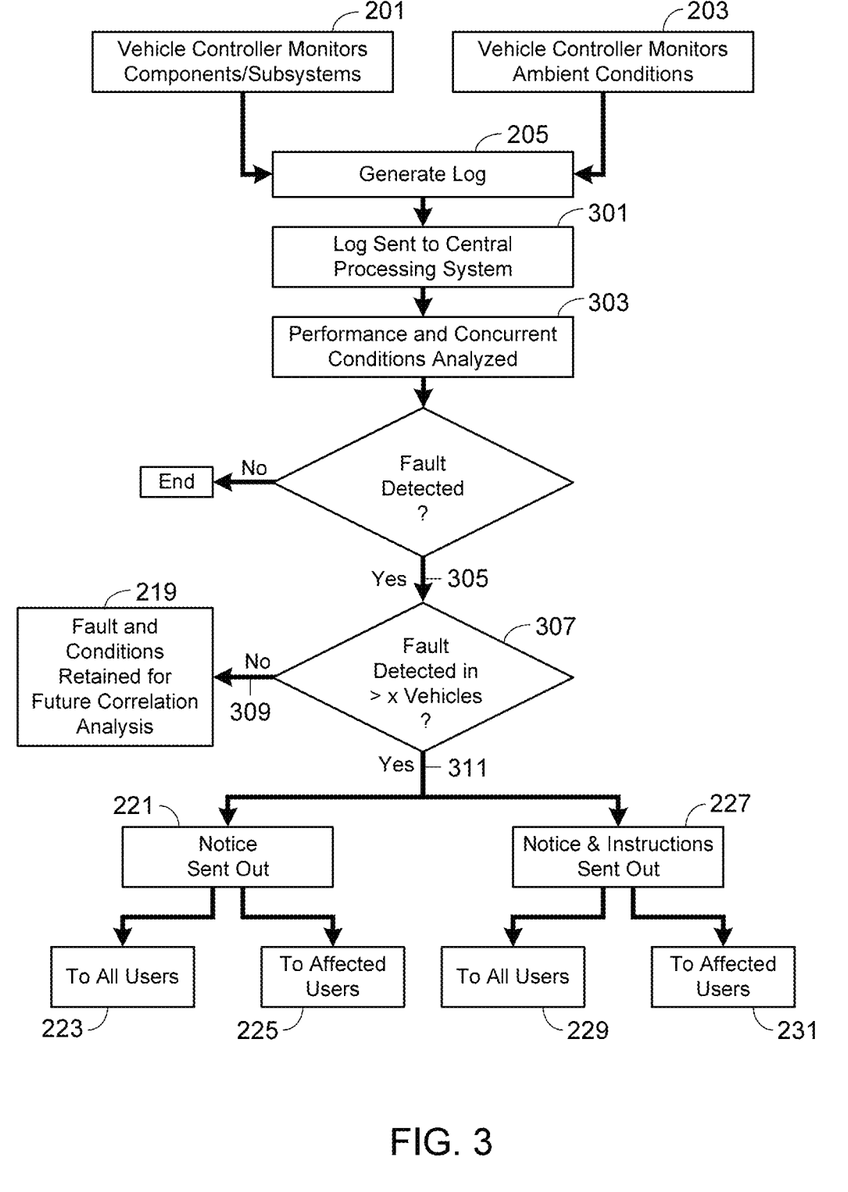
FIG. 3 illustrates a modification of the basic methodology shown in FIG. 2.

In the embodiment illustrated in FIG. 2, the initial fault detection is accomplished using an on-board control and monitoring system. It should be understood, however, that the invention can utilize other configurations as well. For example in the embodiment illustrated in FIG. 3, while the on-board system monitors vehicle performance and ambient conditions, that data is either continuously or periodically sent to central processing system 101 (step 301) for analysis (step 303). Once the central processing system 101 detects a fault in a vehicle component or subsystem (step 305), it correlates the fault and the conditions surrounding that fault with similar faults detected in other vehicles 103 (step 307). As in the prior embodiment, if the detected fault has not been observed in sufficient vehicles under similar conditions (step 309), then the central processing system 101 simply records the fault and the conditions surrounding the fault for possible correlation with future detected events (step 219). If the central processing system 101 determines that the fault has been observed in a sufficient number of vehicles under similar conditions (step 311), then the system either transmits a warning to the users (step 221), or transmits a warning notification along with instructions to users, where the instructions explain how to either avoid the fault or mitigate its effects (step 227). As in the prior embodiment, the warning (step 221) and/or the warning plus instructions (step 227) may either be sent to all users (steps 223/229) or only to those vehicles that are likely to experience the same fault based on the affected vehicle's current ambient conditions (steps 225/231).

Figure 4:
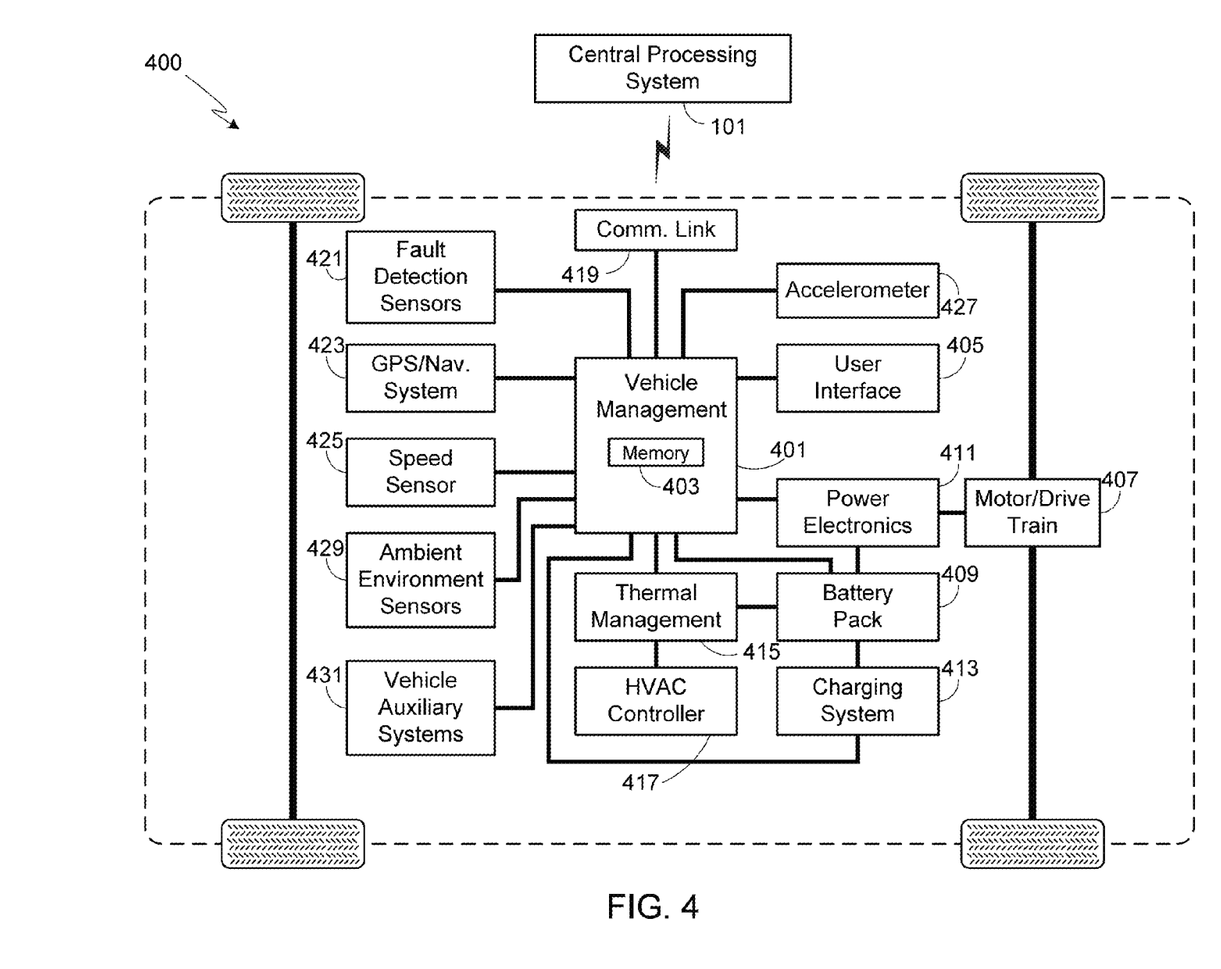
FIG. 4 provides a system level diagram of the primary systems utilized in at least one embodiment of the invention.

FIG. 4 is a high-level view of an EV 400 and the primary systems that may be utilized by the present invention. It should be understood that although the system of the invention is illustrated with an EV, it is equally suited for use with a vehicle utilizing an internal combustion engine (ICE), or with a hybrid vehicle, where a hybrid vehicle utilizes multiple sources of propulsion including an electric drive system.

Vehicle 400 includes a vehicle system controller 401, also referred to as a vehicle management system, which is comprised of a central processing unit (CPU). System controller 401 also includes memory 403, with memory 403 being comprised of EPROM, EEPROM, flash memory, RAM, solid state drive, hard disk drive, or any other type of memory or combination of memory types. In addition to other tasks, memory 403 is used in at least one preferred configuration of the invention to store the log of vehicle performance, faults, and ambient conditions as described above.

Coupled to the vehicle system controller 401 is a user interface 405. Interface 405 allows the driver, or a passenger, to interact with the vehicle management system, for example inputting data into the navigation system, altering the heating, ventilation and air conditioning (HVAC) system, controlling the vehicle's entertainment system (e.g., radio, CD/DVD player, etc.), adjusting vehicle settings (e.g., seat positions, light controls, etc.), and/or otherwise altering the functionality of vehicle 400. In at least some embodiments, interface 405 also includes means for the vehicle management system to provide information to the driver and/or passenger, information such as a navigation map or driving instructions as well as the operating performance of any of a variety of vehicle systems (e.g., battery pack charge level for an EV, fuel level for an ICE-based or hybrid vehicle, selected gear, current entertainment system settings such as volume level and selected track information, external light settings, current vehicle speed, current HVAC settings such as cabin temperature and/or fan settings, etc.). Interface 405 may also be used to warn the driver of a vehicle condition (e.g., low battery charge level or low fuel level) and/or communicate an operating system malfunction (battery system not charging properly, low oil pressure for an ICE-based vehicle, low tire air pressure, etc.). Preferably interface 405 is also used to receive fault warnings (e.g., step 221) and/or fault warnings combined with instructions (step 227). Interface 405 may be comprised of a single interface, for example a touch-screen display, or a combination of user interfaces such as push-button switches, capacitive switches, slide or toggle switches, gauges, display screens, warning lights, audible warning signals, etc. It will be appreciated that if user interface 405 includes a graphical display, controller 401 may also include a graphical processing unit (GPU), with the GPU being either separate from or contained on the same chip set as the CPU.

Vehicle 400 includes one or more motors 407 that provide vehicle propulsion, although as previously noted the invention is equally applicable to ICE-based or hybrid vehicles in which case motor(s) 407 would be replaced with an internal combustion engine or a hybrid drive train. The vehicle's drive system (e.g., motor 407) may be mechanically coupled to the front axle/wheels, the rear axle/wheels, or both, and may utilize any of a variety of transmission types (e.g., single speed, multi-speed) and differential types (e.g., open, locked, limited slip). Assuming that vehicle 400 is an EV as shown, the vehicle includes a battery pack 409, which may be comprised of one or hundreds or thousands of rechargeable batteries, that supplies the power necessary for operation of motor(s) 407. Additionally, battery pack 409 may provide the power necessary for the various vehicle systems that require electrical power (e.g., lights, entertainment systems, navigation system, etc.). Typically battery pack 409 is coupled to motor(s) 407 via a power control system 411 that insures that the power delivered to the drive motor is of the proper form (e.g., correct voltage, current, waveform, etc.). Battery pack 409 is charged by charging system 413, which may either be integrated into the vehicle as shown, or be comprised of an external charging system. Typically charging system 413 is configured to be electrically connected to an external power source, not shown, such as the municipal power grid. Battery pack 409 may also be charged, at least in part, using an on-board system such as a regenerative braking system.

Vehicle 400 includes a thermal management system 415 that includes both a heating subsystem and a cooling subsystem. Thermal management system 415 is coupled to the HVAC system controller 417 used to maintain the passenger cabin within the desired temperature range. Assuming vehicle 400 is an EV as shown, thermal management system 415 is also used to insure that the batteries within battery pack 409 are maintained within the desired operating, charging and/or storage temperature range.

Coupled to vehicle management system 401 is a communication link 419 that is used to wirelessly transmit data (e.g., the data log containing component/subsystem performance, detected faults, ambient conditions, etc.) to central processing system 101. As previously noted, central processing system 101 may be located at the vehicle's manufacturer, a service center, a third party, etc.). Communication via link 419 may use any of a variety of different technologies (e.g., GSM, EDGE, UMTS, CDMA, DECT, WiFi, WiMax, etc.). Preferably communication link 419, along with interface 405, is also used to receive fault warnings (e.g., step 221) and/or fault warnings combined with instructions (step 227) from central processing system 101.

In addition to the subsystems and sensors that are used by the driver and/or passengers for routine vehicle operation (e.g., audio system, light controls, windshield wiper controls, etc.), a variety of sensors 421 are also coupled to vehicle management system 401 and used to detect out-of-specification performance (e.g., faults) of various vehicle components and subsystems. As previously noted, sensors 421 may include temperature sensors located in temperature sensitive regions of the vehicle (e.g., battery pack, motor, drive train, etc.), motor (or engine) speed sensors, battery pack performance sensors that may monitor various characteristics of the battery pack 409 (e.g., charge/discharge rates, SOC, etc.), as well as a variety of additional sensors if vehicle 400 is an ICE-based or hybrid vehicle (e.g., engine temperature, air flow through the air intake, oxygen concentration, emissions, oil pressure, etc.).

Vehicle 400 includes a variety of sensors that monitor ambient conditions, i.e., both environmental conditions and operating conditions, in addition to those sensors 421 that are used to monitor component and subsystem performance. As described above, by knowing the ambient conditions at the time that a fault, performance anomaly, or out-of-spec performance is detected, it is possible to determine the ambient conditions that may have affected a component or subsystem's performance, thereby allowing the problem to be avoided or its effects to be limited. Preferably vehicle 400 includes a wide array of ambient condition sensors. For example, GPS and navigation system 423 allows the location of vehicle 400 to be known before, during and after a fault is detected. Vehicle performance as well as information as to how aggressively the vehicle is being driven is preferably provided by both speed sensor 425 and accelerometer(s) 427. A variety of ambient environmental sensors 429 monitor external conditions. Sensors 429 may include temperature sensor(s), humidity sensor(s), precipitation sensor(s), elevation sensor(s), etc. Various auxiliary systems 431 (e.g., a vehicle suspension system) may also be coupled to, and monitored by, vehicle management system 401, thereby providing additional information about the vehicle's performance during normal use as well as when a fault is detected.

Systems and methods have been described in general terms as an aid to understanding details of the invention. In some instances, well-known structures, materials, and/or operations have not been specifically shown or described in detail to avoid obscuring aspects of the invention. In other instances, specific details have been given in order to provide a thorough understanding of the invention. One skilled in the relevant art will recognize that the invention may be embodied in other specific forms, for example to adapt to a particular system or apparatus or situation or material or component, without departing from the spirit or essential characteristics thereof. Therefore the disclosures and descriptions herein are intended to be illustrative, but not limiting, of the scope of the invention.

What is claimed is:

1. A method of automatically providing a warning notification to a plurality of vehicles, where each vehicle of said plurality of vehicles utilizes an on-board controller comprising a central processing unit (CPU) and a memory, and wherein said on-board controller of each vehicle of said plurality of vehicles is coupled to a plurality of on-board sensors, the method comprising:

monitoring a set of battery pack characteristics with said plurality of on-board sensors, said set of battery pack characteristics selected from the group consisting of a battery pack operating temperature, a state-of-charge (SOC) and a discharge rate, wherein each vehicle of said plurality of vehicles monitors said set of battery pack characteristics with said on-board controller;

monitoring a set of ambient environmental conditions with said plurality of on-board sensors, said set of ambient environmental conditions selected from the group consisting of an ambient temperature, a precipitation level, a humidity level, an atmospheric pressure, and an elevation, wherein each vehicle of said plurality of vehicles monitors said set of ambient environmental conditions with said on-board controller;

transmitting a data log comprising said set of battery pack characteristics and said set of ambient environmental conditions concurrent with said set of battery pack characteristics to a central processing system, wherein each vehicle of said plurality of vehicles performs said transmitting step utilizing said on-board controller;

analyzing a plurality of data logs, said plurality of data logs comprised of said data log received from each vehicle of said plurality of vehicles, wherein said central processing system performs said analyzing step, and wherein said analyzing step further comprises comparing each set of battery pack characteristics corresponding to each data log of said plurality of data logs to a set of desired operating characteristics;

identifying each occurrence of a fault event within said plurality of data logs, wherein said fault event occurs when at least one of said set of battery pack characteristics falls outside of said set of desired operating characteristics, wherein said central processing system performs said identifying step;

comparing a plurality of fault events corresponding to said plurality of data logs, wherein said central processing system performs said step of comparing said plurality of fault events;

identifying a subset of said plurality of fault events, wherein said ambient environmental conditions concurrent with each fault event of said subset of said plurality of fault events are analogous; and transmitting said warning notification to each vehicle of said plurality of vehicles when a numerical value corresponding to a number of fault events comprising said subset of said plurality of fault events exceeds a preset value, wherein said step of transmitting said warning notification is performed by said central processing system, and wherein said warning notification identifies said fault event of said subset of said plurality of fault events and said ambient environmental conditions concurrent with said fault event.

2. The method of claim 1, wherein said step of transmitting said data log to said central processing system is performed periodically by each vehicle of said plurality of vehicles.

3. The method of claim 1, wherein said step of transmitting said data log to said central processing system is performed continuously by each vehicle of said plurality of vehicles.

4. The method of claim 1, wherein said step of transmitting said warning notification further comprises the step of wirelessly transmitting said warning notification to an on-board user interface incorporated into each vehicle of said plurality of vehicles.

5. The method of claim 1, wherein said step of transmitting said warning notification further comprises the step of wirelessly transmitting said warning notification via an application installed on each of a plurality of user smartphones.

6. The method of claim 1, wherein said step of transmitting said warning notification further comprises the step of transmitting a set of fault mitigation instructions to each vehicle of said plurality of vehicles, wherein said set of fault mitigation instructions correspond to said fault event of said subset of said plurality of fault events.

7. The method of claim 6, wherein said step of transmitting said set of fault mitigation instructions further comprises the step of wirelessly transmitting said set of fault mitigation instructions to an on-board user interface incorporated into each vehicle of said plurality of vehicles.

8. The method of claim 1, wherein said step of transmitting said warning notification further comprises the step of wirelessly transmitting a set of fault mitigation instructions via an application installed on each of a plurality of user smartphones, wherein said set of fault mitigation instructions correspond to said fault event of said subset of said plurality of fault events.

9. The method of claim 1, said data log further comprising a set of vehicle conditions concurrent with said set of battery pack characteristics, said set of vehicle conditions selected from the group consisting of throttle position, vehicle speed, steering wheel position, motor speed, motor temperature, drive train temperature, and heating, ventilation and air conditioning (HVAC) settings.

10. The method of claim 9, wherein said warning notification identifies said fault event of said subset of said plurality of fault events and said set of vehicle conditions concurrent with said fault event.

11. The method of claim 1, said set of ambient environmental conditions further comprising a current vehicle location.

12. The method of claim 11, wherein said warning notification identifies said fault event of said subset of said plurality of fault events and said current vehicle location concurrent with said fault event.

13. The method of claim 1, said data log further comprising a drive train operating temperature concurrent with said set of battery pack characteristics, wherein said analyzing step further comprises comparing said drive train operating temperature to a desired drive train operating temperature, wherein said fault event occurs when said drive train operating temperature exceeds said desired drive train operating temperature.

* * * * *